(12) United States Patent
Hien et al.

(10) Patent No.: US 6,306,990 B1
(45) Date of Patent: *Oct. 23, 2001

(54) FILM-FORMING POLYMERS

(75) Inventors: Stefan Hien, Erlangen; Michael Sebald, Weisendorf, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 09/299,365

(22) Filed: Apr. 26, 1999

(30) Foreign Application Priority Data

Apr. 24, 1998 (DE) .............................. 198 18 446

(51) Int. Cl.$^7$ .................................................. C08F 222/04
(52) U.S. Cl. .................. 526/272; 526/271; 526/318.2; 526/318.4; 526/319; 526/322; 526/323.2; 526/328.5; 526/329; 430/192; 430/193; 430/270.1; 522/153
(58) Field of Search ..................... 526/272, 271, 526/318.2, 318.4, 319, 322, 323.2, 328.5, 329; 430/270.1, 192, 193; 522/153

(56) References Cited

U.S. PATENT DOCUMENTS

| | | | |
|---|---|---|---|
| 5,171,656 | * 12/1992 | Sebald et al. | 430/189 |
| 5,194,629 | * 3/1993 | Kuehn et al. | 548/531 |
| 5,237,024 | 8/1993 | Allberry et al. . | |
| 5,360,693 | * 11/1994 | Sebald et al. | 430/192 |
| 5,482,816 | 1/1996 | Murata et al. | 430/270.14 |
| 5,648,195 | * 7/1997 | Sebald et al. | 430/170 |
| 5,703,186 | * 12/1997 | Sezi et al. | 526/272 |
| 6,063,543 | * 5/2000 | Hien et al. | 430/270.1 |

FOREIGN PATENT DOCUMENTS

| | | |
|---|---|---|
| 0 342 493 A2 | 11/1989 | (EP) . |
| 0 388 484 A1 | 9/1990 | (EP) . |
| 0 412 385 A1 | 2/1991 | (EP) . |
| 0 494 383 A1 | 7/1992 | (EP) . |
| 0 645 679 A1 | 3/1995 | (EP) . |
| 0 689 098 A2 | 12/1995 | (EP) . |
| 0 789 278 A2 | 8/1997 | (EP) . |
| 0 841 353 A1 | 5/1998 | (EP) . |

OTHER PUBLICATIONS

International Patent Application WO 96/24621 (Sebald et al.), dated Aug. 15, 1996.
Chemical Abstract XP 002004078.
International patent Application WO 97/14079 (Darling et al.), dated Apr. 17, 1997.
International Publication WO 97/14079 (Darling et al.), dated Apr. 17, 1997.
International Patent Application WO 89/07786 (Yamamoto et al.), dated Aug. 24, 1989.
International Patent Application WO 89/07786 (Sebald et al.), dated Aug. 15, 1996.

* cited by examiner

Primary Examiner—David W. Wu
Assistant Examiner—Tanya Zalukaeva
(74) Attorney, Agent, or Firm—Herbert L. Lerner; Laurence A. Greenberg; Werner H. Stemer

(57) ABSTRACT

Film-forming, functionalized polymers having 1,2-dicarboxylic acid monoester groups have at least two polymer units, one of which is acid-labile and hydrolysis-stable and the other is thermally stable. These polymers are used in particular in photoresists.

21 Claims, No Drawings

FILM-FORMING POLYMERS

BACKGROUND OF THE INVENTION

FIELD OF THE INVENTION

The invention relates to novel film-forming, functionalized polymers having 1,2-dicarboxylic acid monoester groups.

Film-forming, functionalized polymers which have long been known are used for coating metals, papers and textiles and in the cosmetics industry, for example in hairsprays. Such polymers are also used in the pharmaceutical industry, for example for encapsulating or for immobilizing active substances. Electronic applications are, for example, in the area of NLO polymers, i.e. nonlinear optically active polymers, and of photoresists. In the latter case, mixtures of the polymers and photoactive, i.e. radiation-sensitive, components are used, for example for structuring semiconductor components. An important requirement here is a high transparency of the polymers at the exposure wavelength. Polymers which are used in the printing plate industry or in photocuring also have to meet similar requirements.

The preparation of monoesters of maleic acid copolymers and their use in photoresists is disclosed, for example, in International Application WO 96/24621. International Application WO 97/14079 likewise discloses the use of polymers having vicinal dicarboxylic acid monoester groups in photoresists. International Application WO 89/07786 describes the alcoholysis of copolymers of maleic anhydride and cycloaliphatic hydrocarbons.

SUMMARY OF THE INVENTION

It is the object of the invention to provide novel film-forming, functionalized polymers which have 1,2-dicarboxylic acid monoester groups, are suitable for various applications and can be used in particular in photoresists.

This and related objects are achieved, according to the invention, by film-forming polymers functionalized with 1,2-dicarboxylic acid monoester groups, comprising an acid-labile, hydrolysis-stable polymer unit (A) of structure:

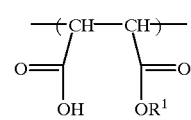

(1)

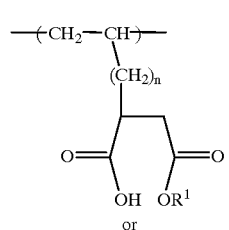

(2)

or

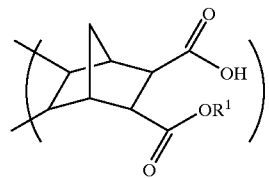

(3)

a thermally stable polymer unit (B) of structure:

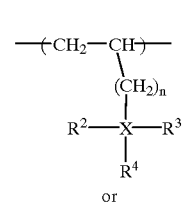

(4)

or

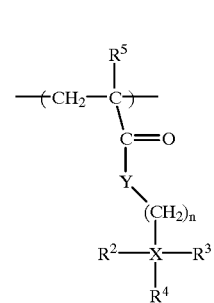

(5)

a second thermally stable polymer unit (C) of structure

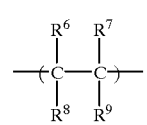

(6)

and a polymer unit (D) bearing reactive groups and having a structure

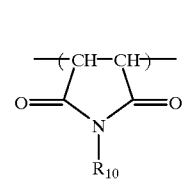

(7)

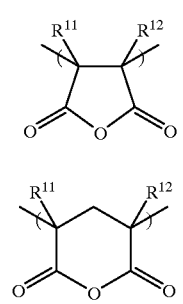

(8a)

(8b)

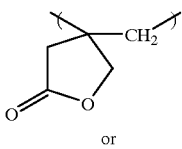

(8c)

or

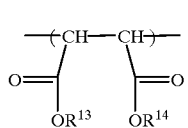

(9)

in which the amount of (A) is from 1 to 99 mol %, the amount of (B) is from 1 to 99 mol %, the amount of (C) is from 0 to 50 mol %, and the amount of (D) is from 0 to 50 mol %, provided that the amounts of (A), (B), (C), and (D) total 100 mol %; and in which n=0, 1, 2 or 3, $R^1$ is a hydrocarbon radical which is bonded via a tertiary C atom to the O atom and having a total of 4 to 10 C atoms, or a 2-tetrahydrofuranyl or 2-tetrahydropyranyl radical, $R^2$, $R^3$ and $R^4$—independently of one another—are $C_{1-}$ to $C_{6-}$ alkyl or $C_{1-}$ to $C_{6-}$ alkoxy, $C_{6-}$ to $C_{18-}$ aryl or $C_{6-}$ to $C_{18-}$ aryloxy or aralkyl having a $C_{6-}$ to $C_{18-}$ aryl group and a $C_{1-}$ to $C_{4-}$ alkylene radical, $R^5$ is H or $C_{1-}$ to $C_{6-}$ alkyl, $R^6$, $R^7$, $R^8$ and $R^9$—independently of one another—are H, $C_{1-}$ to $C_{6-}$ alkyl, $C_{6-}$ to $C_{18-}$ aryl, halogen, CN, methoxyphenyl or a radical of structure

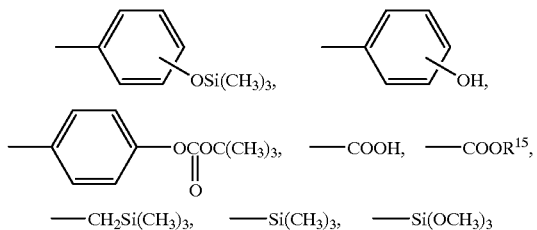

where $R^{15}$ is H, $C_{1-}$ to $C_{6-}$ alkyl, $C_{6-}$ to $C_{18-}$ aryl, $CH_2$=CH— (vinyl), $CH_2$=CH—$CH_2$-(allyl), or $CH_2$=CH—CO—;

$R^{10}$ is H, $C_{1-}$ to $C_{6-}$ alkyl, $C_{2-}$ to $C_{6-}$ alkenyl, $C_{6-}$ to $C_{18-}$ aryl, halogen or halogen-substituted $C_{1-}$ to $C_{6-}$ alkyl;

$R^{11}$ and $R^{12}$—independently of one another—are linear $C_{1-}$ to $C_{18-}$ alkyl;

$R^{13}$ and $R^{14}$—independently of one another—are linear $C_{1-}$ to $C_{18-}$ alkyl or tert-butyl;

X is Si or Sn and

Y is O or NH.

The amounts of the polymer units (A) and (B) sum to 100 mol % when only such polymer units are present. When polymer units (C) and/or (D) are present in amounts greater than 0 mol %, the amounts of polymer units (A), (B), (C) and/or (D) sum to 100 mol %. By suitable choice of amounts of these polymer units and the corresponding ratios of the unsaturated monomer source of these polymer units, the polymer properties, such as glass transition temperature and solubility, can be controlled.

The amount of polymer unit (A) of the polymer is preferably from 5 to 50 mol %. The amount of polymer units (C) and or (D) when present is in the range from 1 to 50 mol %, preferably from 5 to 15 mol % and 1 to 10 mol %, respectively.

As a feature of this invention, the hydrolytically stable and acid labile polymer units (A) are resistant to exposure to water and acidic solutions up to 70° C. As a further feature of this invention, the thermally stable polymer units (B) and (C) resist depolymerization and degradation of the polymer chain up to 230° C. under thermal conditions and the polymer units (A) decompose thermally above 150° C. and at 135° C. or more under acid-catalyzed conditions, while the film forming polymers of the invention can be selectively converted to either positive or negative photoresist by controlled heat treatment at a suitable temperature followed by development in an aqueous alkaline solution.

DESCRIPTION OF THE PREFERRED EMBODIMENTS

In the polymer of this invention, the radical $R^1$ may be, for example, a tert-butyl radical —$C(CH_3)_3$, a tert-pentyl radical —$C(CH_3)_2$—$C_2H_5$ or a 1-adamantyl radical (—$C_{10}H_{15}$). An important feature of the polymer unit (B) is its metallic component, i.e. the presence of silicon Si or tin Sn.

The polymer according to the invention can have 1,2-dicarboxylic acid monoester groups as in the structural units(1), (2), or (3), on the chain or as pendant groups. A polymer comprising units (A) and (B) having groups on the chain can be prepared, for example, by reacting a maleic anhydride copolymer with tert-butanol. The mono-tert-butyl 1,2-dicarboxylate groups can also be introduced into the polymer by homo- or copolymerization of mono-tert-butyl fumarate or maleate.

Polymers having pendant 1,2-dicarboxylic acid monoester groups, i.e. having groups which are not bonded directly to the polymer main chain but are situated outside the main chain, can be obtained, for example, by homopolymerization of or copolymerization with 1-alkyl-2-(3-alkylenesuccinic anhydride)-ethylene and subsequent reaction with tert-butanol or by homopolymerization of 1-alkyl-2-(mono-tert-butyl 3-alkylenesuccinate)-ethylene. In the case of the structural unit (3), the 1,2-dicarboxylic acid monoester groups are bonded via a norbornyl radical to the polymer main chain.

The polymers according to the invention have weight average molecular weight in the range from 5000 to 15000, typically approximately 12000, and glass transition temperatures in the range from 110 to 150° C., typically 130° C. The characteristic vibrational bands in the infra-red spectrum of the monoester moieties (polymer unit A) are at 1730 and 1710 $cm^{-1}$. Tert-butyl succinate monoester moieties also have a characteristic band at 1150 $cm^{-1}$. Bands characteristic of anhydride groups are found at 1750 and 1780 $cm^{-1}$.

For the preparation of polymers according to the invention, in general an unsaturated monomer source for the polymer units (A) is copolymerized with an electron-rich monomer source for the polymer units (B). The monomer source for polymer units (a) of structure (1) is a monoester of maleic acid or fumaric acid in which the esterifying group $R^1$ is as defined above. The monomer source for polymer unit (A) of structure (2) can be monoester of alkylidenesuccinic acid, alkylmaleic acid or alkylfumaric acid in which the esterifying group $R^1$ is as defined above. The monomer source for polymer unit (A) of structure (3) can be a norbornenedicarboxylic acid monoester in which the esterifying group $R^1$ is as defined above. The monomer source for polymer unit (B) is an unsaturated compound with high electron density at the double bond, such as an allyl compound (leading to structure (4)) or an acrylic ester or amide (leading to structure (5)). As a result of this copolymerization, on the one hand high polymer yields are achieved and on the other hand the physical properties of the polymers can be controlled. Thus for example, a specific Si content can be realized.

In addition to the polymer units (A) and(B), the polymers according to the invention advantageously can include a further thermally stable polymer unit (C) as defined above and also a further polymer unit (D) as defined above.

The polymer unit (D) has reactive groups which permit an after treatment of the polymer. For this purpose, (D) contains either an imido group (structural unit 7) or an anhydride or lactone group (structural unit 8) or a dialkyl dicarboxylate group (structural unit 9). The anhydride group is based on succinic anhydride (structural unit 8a) or glutaric anhydride (structural unit 8b) and the lactone group is based on γ-butyrolactone (structural unit 8c). An R substituent in polymer unit (D) can be, for example, an ethyl group.

Modifying agents advantageously used in reaction with polymer units (D) for effective aftertreatment include amines such as bis(aminoalkyl)oligodimethylsiloxane.

Other features which are considered as characteristic for the invention are set forth in the appended claims.

Although the invention is illustrated and described herein as embodied in film-forming polymers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments.

The invention is to be explained in more detail with reference to Working Examples, in which pbw is used to indicate parts by weight.

EXAMPLE 1
Preparation of a Copolymer Having Mono-tert-butyl 1,2-dicarboxylate Groups 11.3 pbw of tert-butyl trimethylsilylfumarate (prepared by reacting tert-butyl fumarate with hexamethyldisilazane or with trimethylchlorosilane analogously to J. Polym. Sci., Part A: Polym. Chem. Vol. 25 (1987), pages 979 to 986) are dissolved under an inert gas atmosphere together with 5.7 pbw of allyltrimethylsilane and 0.08 pbw of azobisisobutyronitrile in 15 pbw of dry ethyl acetate and then heated to the boil. After 24 hours, 1 pbw of water is added and the mixture is heated to the boil for a further 3 hours; it is then cooled to room temperature. By dropwise addition of the polymer solution to petroleum ether (boiling range from 60 to 80° C.), subsequent filtration and drying at 50° C. for 24 hours in vacuo, 10 pbw of colorless polymer powder are obtained.

EXAMPLE 2
Preparation of a Copolymer Having Mono-tert-butyl 1,2-dicarboxylate Groups 8 pbw of tert-butyl fumarate (prepared analogously to J. Heterocyclic Chem. Vol. 32 (1995), pages 1309 to 1315) are dissolved together with 5.7 pbw of allyltrimethylsilane and 0.08 pbw of azobisisobutyronitrile in 15 pbw of ethyl acetate. The solution is heated to the boil for 24 hours and then cooled to room temperature. By dropwise addition of the polymer solution to petroleum ether (boiling range from 60 to 80° C.), subsequent filtration and drying at 50° C. for 24 hours in vacuo, 10 pbw of colorless polymer powder are obtained.

EXAMPLE 3
Preparation of a Terpolymer Having Mono-tert-butyl 1,2-dicarboxylate Groups 6 pbw of tert-butyl fumarate (prepared analogously to J. Heterocyclic Chem. Vol. 32 (1995), pages 1309 to 1315) and 2.5 pbw of 1-hexene are dissolved together with 5.7 pbw of allyltrimethylsilane and 0.08 pbw of azobisisobutyronitrile in 15 pbw of ethyl acetate. The solution is heated to the boil for 24 hours and then cooled to room temperature. By dropwise addition of the polymer solution to petroleum ether (boiling range from 60 to 80° C.), subsequent filtration and drying at 50° C. for 24 hours in vacuo, 9.5 pbw of colorless polymer powder are obtained.

EXAMPLE 4
Preparation of a Quaterpolymer Having Mono-tetrahydrofuranyl 1,2-dicarboxylate groups 4 pbw of tetrahydrofuranyl fumarate, 2 pbw of maleimide and 2.5 pbw of 1-hexene are dissolved together with 5.7 pbw of allyltrimethylsilane and 0.08 pbw of azobisisobutyronitrile in 15 pbw of ethyl acetate. The solution is heated to the boil for 24 hours and then cooled to room temperature. By dropwise addition of the polymer solution to petroleum ether (boiling range from 60 to 80° C.), subsequent filtration and drying at 50° C. for 24 hours in vacuo, 10.5 pbw of colorless polymer powder are obtained.

We claim:

1. A film-forming polymer functionalized with 1,2-dicarboxylic acid monoester groups, comprising an acid-labile, hydrolysis-stable polymer unit (A) of structure:

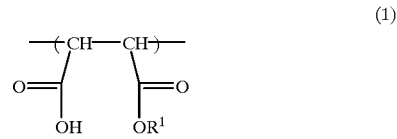

(1)

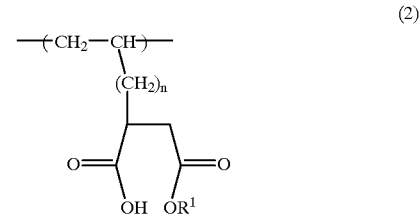

(2)

or

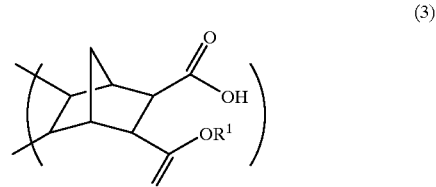

(3)

a thermally stable polymer unit (B) of structure:

(4)

$$-(CH_2-CH)-$$
$$\qquad |$$
$$\qquad (CH_2)_n$$
$$R^2-X-R^3$$
$$\qquad |$$
$$\qquad R^4$$

or (5)

$$-(CH_2-C(R^5))-$$
$$\qquad |$$
$$\qquad C=O$$
$$\qquad |$$
$$\qquad Y$$
$$\qquad |$$
$$\qquad (CH_2)_n$$
$$R^2-X-R^3$$
$$\qquad |$$
$$\qquad R^4$$

a second thermally polymer unit (C) of structure (6)

$$-(C(R^6)(R^8)-C(R^7)(R^9))-$$

and a polymer unit (D) bearing reactive groups and having a structure (7)

a 2,5-dioxopyrrolidine ring with N–R$^{10}$ (8a)

a 5-membered anhydride ring with R$^{11}$, R$^{12}$ (8b)

a 6-membered glutaric anhydride ring with R$^{11}$, R$^{12}$ (8c)

a γ-butyrolactone ring with CH$_2$ substituent or (9)

$$-(CH-CH)-$$
$$\quad |\qquad |$$
$$\quad C=O\ \ C=O$$
$$\quad |\qquad |$$
$$\quad OR^{13}\ OR^{14}$$

in which the amount of (A) is from 1 to 99 mol %, the amount of (B) is from 1 to 99 mol %, the amount of (C) is from 0 to 50 mol %, and the amount of (D) is from 0 to 50 mol %, provided that the amounts of (A), (B), (C), and (D) total 100 mol %; and in which n=0, 1, 2 or 3, R$^1$ is a hydrocarbon radical which is bonded via a tertiary C atom to the O atom and having a total of 4 to 10 C atoms, or a 2-tetrahydrofuranyl or 2-tetrahydropyranyl radical, R$^2$, R$^3$ and R$^4$—independently of one another—are C$_{1-}$ to C$_{6-}$ alkyl or C$_{1-}$ to C$_{6-}$ alkoxy, C$_{6-}$ to C$_{18-}$ aryl or C$_{6-}$ to C$_{18-}$ aryloxy or aralkyl having a C$_{6-}$ to C$_{18-}$ aryl group and a C$_{1-}$ to C$_{4-}$ alkylene radical, R$^5$ is H or C$_{1-}$ to C$_{6-}$ alkyl, R$^6$, R$^7$, R$^8$ and R$^9$—independently of one another—are H, C$_{1-}$ to C$_{6-}$ alkyl, C$_{6-}$ to C$_{18-}$ aryl, halogen, CN, methoxyphenyl or a radical of structure —C$_6$H$_4$—OSi(CH$_3$)$_3$,   —C$_6$H$_4$—OH,

—C$_6$H$_4$—OC(O)OC(CH$_3$)$_3$,   —COOH,   —COOR$^{15}$,

—CH$_2$Si(CH$_3$)$_3$,   —Si(CH$_3$)$_3$,   —Si(OCH$_3$)$_3$ where

R$^{15}$ is H, C$_{1-}$ to C$_{6-}$ alkyl, C$_{6-}$ to C$_{18-}$ aryl, CH$_2$=CH—, CH$_2$=CH—CH$_2$—, or CH$_2$=CH—CO—;

R$^{10}$ is H, C$_{1-}$ to C$_{6-}$ alkyl, C$_{2-}$ to C$_{6-}$ alkenyl, C$_{6-}$ to C$_{18-}$ aryl, halogen or halogen-substituted C$_{1-}$ to C$_{6-}$ alkyl;

R$^{11}$ and R$^{12}$—independently of one another—are linear C$_{1-}$ to C$_{18-}$ alkyl;

R$^{13}$ and R$^{14}$—independently of one another—are linear C$_{1-}$ to C$_{18-}$ alkyl or tert-butyl;

X is Si or Sn, and

Y is O or NH.

2. The polymer of claim 1, in which the amount of the polymer unit (A) is from 5 to 50 mol %.

3. The polymer of claim 1, in which the amount of the polymer unit (C) is from 1 to 50 mol %.

4. The polymer of claim 1, in which the amount of polymer unit (D) is from 1 to 50 mol %.

5. A polymer of claim 1, in which R$^1$ is tert-butyl.

6. A polymer of claim 1, in which R$^1$ is tetrahydrofuranyl.

7. A polymer of claim 1, in which n=1.

8. A polymer of claim 1, in which each of R$^2$, R$^3$, and R$^4$ is methyl and X is Si.

9. A polymer of claim 1, in which R$^6$, R$^7$, and R$^8$ are each H and R$^9$ is n-hexyl.

10. A polymer of claim 1, in which polymer unit (D) is

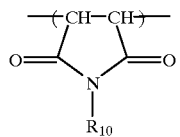
(7)

and $R^{10}$ is methyl.

11. A polymer of claim 1, in which polymer unit (A) is

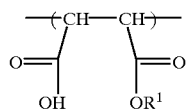
(1)

polymer unit (B) is

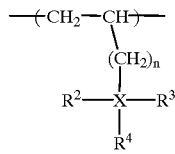
(4)

$R^1$ is tert-butyl, $R^2$, $R^3$ and $R^4$ are each methyl and X is Si.

12. A polymer of claim 1, in which the amount of polymer unit (C) is 10 mol %, $R^6$, $R^7$, and $R^8$ are each H, and $R^9$ is n-hexyl.

13. A polymer of claim 1, in which the amount of polymer unit (C) is 10 mol %, the amount of polymer unit (D) is 5 mol %, $R^6$, $R^7$, and $R^8$ are each H, $R^9$ is n-hexyl and $R^{10}$ is methyl.

14. A polymer according to claim 11, comprising 50 mol % of polymer unit (A) and 50 mol % of polymer unit (B).

15. A process for preparing a polymer of claim 1, in which an unsaturated monomer source of polymer unit (A) is copolymerized in presence of an initiator with an electron rich monomer source of polymer unit (B) having a high electron density at the double bond.

16. A process of claim 15, in which the monomer source of polymer unit (B) is an allyl compound.

17. A process of claim 15, in which the source of polymer unit (A) and the source of polymer unit (B) are copolymerized with a monomer source of polymer unit (c) in which $R^6$, $R^7$, and $R^8$ are each H and $R^9$ is n-hexyl.

18. A process of claim 15, in which the source of polymer unit (A), the source of polymer unit (B), and the source of polymer unit (C) are copolymerized with a monomer source of polymer unit (D) in which $R^{10}$ is methyl.

19. A process of claim 15, in which allyltrimethylsilane is copolymerized with tert-butyl trimethylsilylfumarate.

20. A process of claim 15, in which allyltrimethilsilane is copolymerized with tert-butyl fumarate.

21. The polymer of claim 1, wherein polymer unit (A) has structure (1) in which $R^1$ is 2-tetrahydrofuranyl; polymer unit (B) has structure (4) in which n=1, X=Si, and each of $R^2$, $R^3$, and $R^4$ is a methyl group; polymer unit (C) has structure (6) in which $R^6$ is n-butyl and each of $R^7$, $R^8$, and $R^9$ is hydrogen; and polymer unit (D) has structure (7) in which $R^{10}$ is hydrogen.

* * * * *